US012567801B2

(12) United States Patent
Kuramochi

(10) Patent No.: US 12,567,801 B2
(45) Date of Patent: Mar. 3, 2026

(54) POWER CONVERSION DEVICE HAVING A FUSE CONNECTED IN SERIES WITH A PLATE-LIKE WIRING MEMBER

(71) Applicant: Mitsubishi Electric Corporation, Tokyo (JP)

(72) Inventor: Takuya Kuramochi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 470 days.

(21) Appl. No.: 18/160,055

(22) Filed: Jan. 26, 2023

(65) Prior Publication Data

US 2023/0421056 A1 Dec. 28, 2023

(30) Foreign Application Priority Data

Jun. 28, 2022 (JP) .................................. 2022-103279

(51) Int. Cl.

| | |
|---|---|
| *H02M 3/335* | (2006.01) |
| *H01L 23/367* | (2006.01) |
| *H01L 23/62* | (2006.01) |
| *H02M 1/36* | (2007.01) |
| *H02M 3/00* | (2006.01) |
| *H05K 7/14* | (2006.01) |
| *H05K 7/20* | (2006.01) |

(52) U.S. Cl.
CPC ............. *H02M 3/003* (2021.05); *H02M 1/36* (2013.01); *H02M 3/33573* (2021.05); *H05K 7/209* (2013.01)

(58) Field of Classification Search
CPC .. H01L 23/367; H01L 23/62; H02M 3/33573; H02M 3/003; H05K 7/14329; H05K 7/209; H02H 7/1213
See application file for complete search history.

(56) References Cited

U.S. PATENT DOCUMENTS

| | | | | |
|---|---|---|---|---|
| 5,682,057 A | * | 10/1997 | Kuriyama ............ | H01H 37/761 257/E23.044 |
| 2018/0138828 A1 | * | 5/2018 | Muto ................... | H10D 84/617 |
| 2019/0287933 A1 | * | 9/2019 | Fujii ...................... | H01L 24/73 |

(Continued)

FOREIGN PATENT DOCUMENTS

| | | | | | |
|---|---|---|---|---|---|
| CN | 106409819 A | * | 2/2017 | ........ | H02M 7/53875 |
| DE | 102023117057 A1 | * | 1/2025 | | |

(Continued)

OTHER PUBLICATIONS

Communication issued Oct. 7, 2025 in Japanese Application No. 2022-103279.

*Primary Examiner* — Sisay G Tiku
(74) *Attorney, Agent, or Firm* — Sughrue Mion, PLLC

(57) ABSTRACT

A power conversion device includes a fuse connected to an input power supply, and semiconductor elements connected in series to the input power supply via the fuse, wherein the semiconductor elements have a semiconductor chip, which has an electrode on an upper face thereof, and plate-form wiring members, which are mounted on the electrode and are formed of a plate-form conductor through which current passing through the fuse flows, and are configured by the semiconductor chip and the plate-form wiring members being sealed using a sealing resin, and a fusion time of the fuse is shorter than a fusion time of the plate-form wiring members.

8 Claims, 5 Drawing Sheets

(56)                    References Cited

U.S. PATENT DOCUMENTS

| | | | |
|---|---|---|---|
| 2020/0365497 | A1 | 11/2020 | Saito et al. |
| 2021/0343629 | A1 | 11/2021 | Saito et al. |
| 2023/0245962 | A1 | 8/2023 | Saito et al. |
| 2024/0274513 | A1 | 8/2024 | Saito et al. |
| 2025/0293128 | A1 | 9/2025 | Saito et al. |

FOREIGN PATENT DOCUMENTS

| | | | | | |
|---|---|---|---|---|---|
| JP | 08-242046 | A | | 9/1996 | |
| JP | 2009-295886 | A | | 12/2009 | |
| JP | 2013236490 | A | * | 11/2013 | |
| JP | 5390837 | B2 | * | 1/2014 | .............. H02H 6/00 |
| JP | 2020-096471 | A | | 6/2020 | |
| JP | 2020-188085 | A | | 11/2020 | |
| WO | WO-2018083813 | A1 | * | 5/2018 | .............. H02J 1/102 |
| WO | WO-2018087891 | A1 | * | 5/2018 | .............. H02M 7/48 |

* cited by examiner

POWER CONVERSION DEVICE HAVING A FUSE CONNECTED IN SERIES WITH A PLATE-LIKE WIRING MEMBER

BACKGROUND OF THE INVENTION

Field of the Invention

The present application relates to the field of a power conversion device.

Description of the Background Art

In recent years, development of electric vehicles (EV), and of hybrid vehicles such as hybrid electric vehicles (HEV) and plug-in hybrid electric vehicles (PHEV), is progressing in terms of environmental protection. A high voltage battery that causes a traveling electric motor to drive using charged power is mounted in this kind of vehicle, power of the high voltage battery is converted in a power conversion device mounted in the vehicle, and a desired current and voltage are supplied to a low voltage battery or the electric motor.

This kind of power conversion device is mainly configured of a multiple of semiconductor elements and a magnetic part such as a transformer or a reactor. A semiconductor chip configuring the semiconductor element is such that one end of a wire wiring member configured of a wire is connected to an electrode on an upper face of the semiconductor chip, and another end is connected to a lead frame, as disclosed in, for example, Patent Literature 1. When the semiconductor element is short-circuited due to a gate drive circuit failure or a malfunction, and an overcurrent flows, the wire wiring member is fused.

Herein, when voltage continues to be applied between the wire wiring member and the lead frame even after fusion, an arc is generated, and resin in a periphery of the semiconductor chip carbonizes. Furthermore, when a current flows into the carbonized portion, an abnormal heat generation occurs, and there is heat damage.

In response to this, a power conversion device wherein a fuse is connected in series with a semiconductor element, and the fuse fuses earlier than a wire wiring member of the semiconductor element when an overcurrent flows into the semiconductor element via the fuse, is disclosed in Patent Literature 2. This kind of configuration is such that when an overcurrent flows into a semiconductor element, the fuse fuses before the wire wiring member of the semiconductor element fuses, and a voltage applied to the wire wiring member of the semiconductor element and a flowing current can be interrupted, because of which an arc generation accompanying a fusing of the wire wiring member of the semiconductor element is prevented, and resin in a periphery of a semiconductor chip can be prevented from suffering heat damage due to an abnormal heat generation.

Patent Literature 1: JP-A-8-242046
Patent Literature 2: JP-A-2020-96471

However, this kind of power conversion device is such that as it is necessary that the fuse fuses earlier than the wire wiring member of the semiconductor element, a high performance fuse whose time until fusing when an overcurrent occurs (hereafter called a fusing time) is short needs to be applied. There is a problem in that as a high performance fuse is expensive, the power conversion device increases in cost.

There is a method whereby the number of wire wiring members mounted on an electrode on an upper face of a semiconductor chip is increased in order that an inexpensive fuse can be applied. According to this method, the fusion time of a semiconductor element wire wiring member can be set to be long, because of which a low-priced fuse whose fusion time is long can be applied. However, a semiconductor element fabrication time increases together with an increase in the number of wire wiring members, in addition to which yield worsens, because of which a manufacturing cost increases, and the power conversion device increases in cost.

In addition, a necessity arises to secure an area needed for mounting the wire wiring members commensurate with an amount by which the number of wire wiring members increases using an electrode on a semiconductor chip upper face, because of which a chip size increases, and the semiconductor element increases in cost.

For the above reasons, an existing power conversion device that includes protective means preventing a fusion of a semiconductor element wire wiring member has a problem in that a cost accompanying a mounting of a fuse or a wire wiring member and a cost of a semiconductor chip increase, and the power conversion device increases in cost.

SUMMARY OF THE INVENTION

The present application has been made to solve the above problem, and an object of the present application is to provide a power conversion device that is such that, when an overcurrent flows into a semiconductor element, heat damage accompanying an abnormal heat generation occurring in a resin in a periphery of the semiconductor element can be prevented, and that includes a low-cost overcurrent protection unit.

A power conversion device disclosed in the present application includes a fuse connected to an input power supply, and a semiconductor element connected in series to the input power supply via the fuse, wherein the semiconductor element has a semiconductor chip, which has an electrode on an upper face thereof, and a plate-form wiring member, which is mounted on the electrode and is formed of a plate-form conductor through which current passing through the fuse flows, and is configured by the semiconductor chip and the plate-form wiring member being sealed using a sealing resin, and a fusion time of the fuse is shorter than a fusion time of the plate-form wiring member.

According to the power conversion device disclosed in the present application, a power conversion device that is such that, when an overcurrent flows into a semiconductor element, heat damage occurring in a resin in a periphery of the semiconductor element can be prevented, and that includes a low-cost overcurrent protection unit, is obtained.

The foregoing and other objects, features, aspects, and advantages of the present disclosure will become more apparent from the following detailed description of the present disclosure when taken in conjunction with the accompanying drawings.

DETAILED DESCRIPTION OF THE PREFERRED EMBODIMENTS

Figure 1:
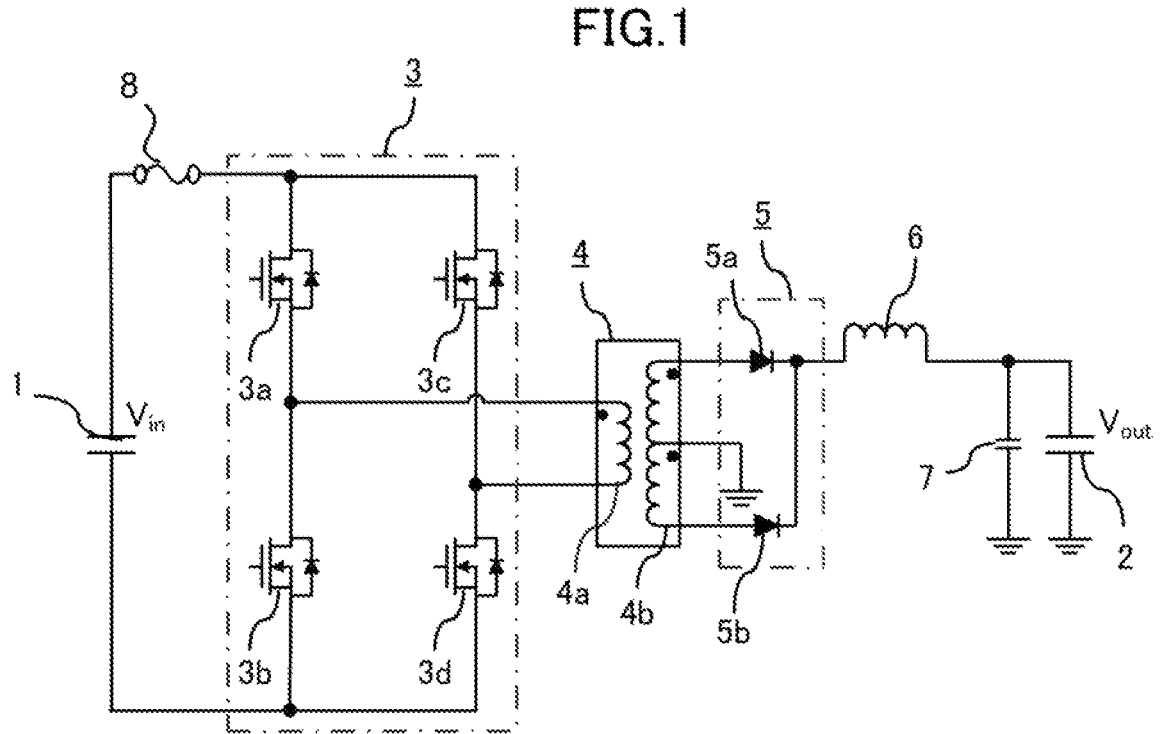
FIG. 1 is a circuit drawing of a power conversion device according to a first embodiment.

Hereafter, a preferred embodiment of a power conversion device according to the present application will be described, using the drawings. Identical or corresponding members and regions in the drawings will be described with identical reference signs allotted.

First Embodiment

FIG. 1 is a circuit configuration drawing of a power conversion device according to a first embodiment. In the present embodiment, a description is given using an insulated DC-DC converter as a power conversion device.

The power conversion device shown in FIG. 1 is a step-down type of converter wherein a voltage lower than an input voltage is output as an output, a direct current voltage Vin of an input power supply 1 is converted, and a direct current voltage Vout is output to a load 2 such as a low voltage battery.

Firstly, a configuration of a power conversion device will be described.

The power conversion device shown in FIG. 1 has the input power supply 1, a single phase inverter 3 that is connected to an output side of the input power supply 1 and configures a full-bridge circuit using semiconductor elements 3a to 3d formed of MOSFETs wherein a parasitic diode is incorporated between a source and a drain, an insulated transformer 4 including a primary winding 4a and a secondary winding 4b wherein the primary winding 4a is connected to the semiconductor elements 3a to 3d, a rectifying circuit 5 that is connected to the secondary winding 4b of the insulated transformer 4 and has diodes 5a and 5b functioning as rectifying elements, an output smoothing smoothing reactor 6 and smoothing capacitor 7 connected to an output side of the rectifying circuit 5, and a fuse 8 that is connected in series with the semiconductor elements 3a to 3d configuring the single phase inverter 3 and the input power supply 1, and is connected between the input power supply 1 and the single phase inverter 3. Herein, the semiconductor elements 3a to 3d configure primary side semiconductor elements, and the diodes 5a and 5b configure secondary side semiconductor elements.

The power conversion device of the heretofore described configuration is such that power supplied from the input power supply 1 is output as power converted into a desired voltage and current by power conversion, and the direct current voltage Vout is output to the load 2, which is a low voltage battery or the like.

A secondary side of the transformer 4 is a center-tapped type, a center tap terminal is connected to a ground, and other terminals of the secondary winding 4b are connected one each to anode terminals of the diodes 5a and 5b. Cathode terminals of the diodes 5a and 5b are connected to the smoothing reactor 6. The fuse 8 is connected directly between the input power supply 1 and the single-phase inverter 3. Herein, the semiconductor elements 3a to 3d configuring the single-phase inverter 3 and the diodes 5a and 5b configuring the rectifying circuit 5 are sealed in the same package using a resin, and are configured as a semiconductor module (hereafter called a module) 9 shown in FIGS. 2A and 2B.

Figure 2A:
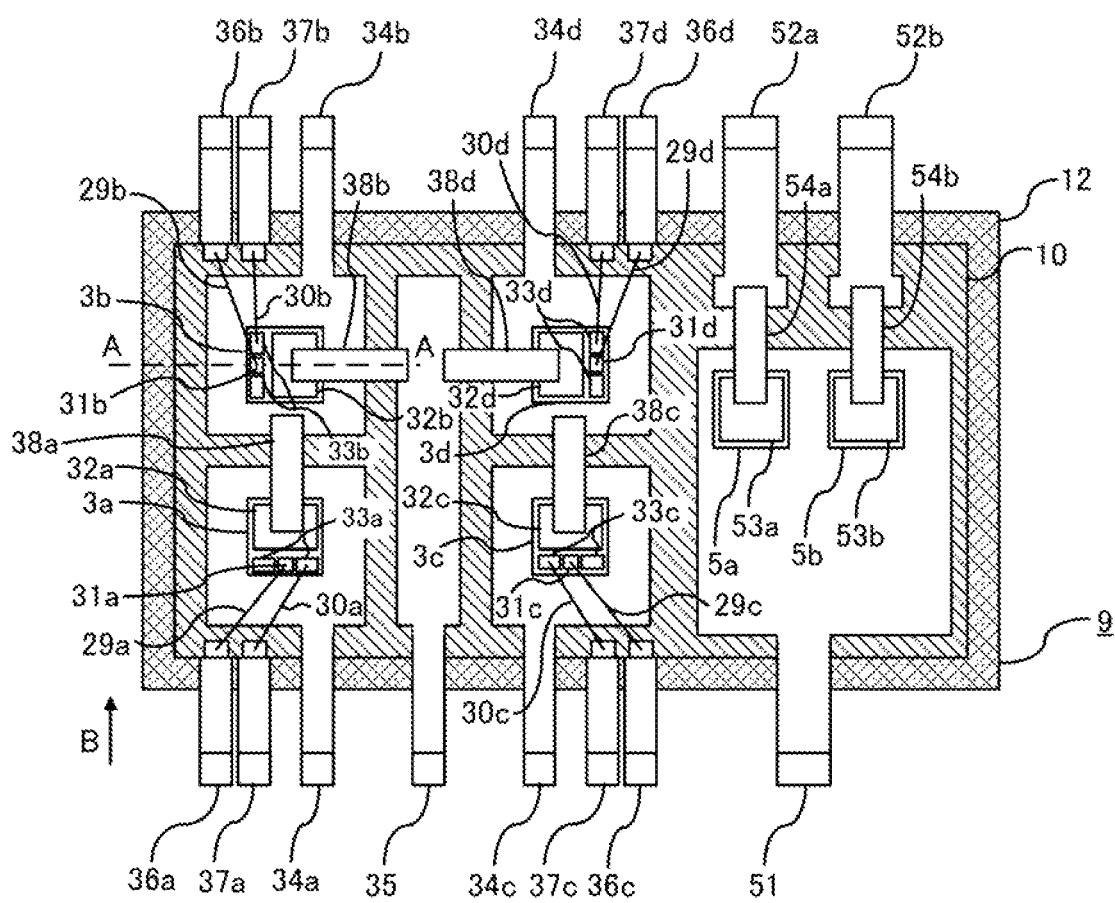
FIGS. 2A and 2B are drawings showing an internal configuration of a semiconductor module used in the power conversion device according to the first embodiment.
Figure 2B:
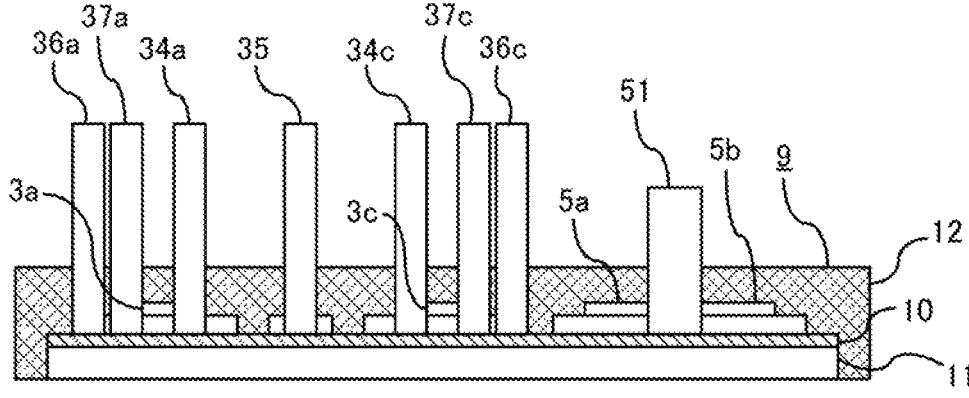

Next, a configuration of the module 9 will be described, using FIGS. 2A and 2B. FIG. 2A is an upper perspective view of the module 9, and FIG. 2B is a sectional perspective view, wherein one portion is omitted, seen from an arrow B direction of FIG. 2A. In FIGS. 2A and 2B, places corresponding to FIG. 1 are allotted identical reference signs.

Firstly, a sectional structure of the module 9 will be described using FIGS. 2A and 2B.

The semiconductor elements 3a to 3d configuring the module 9 have a drain electrode on a bottom face, and have semiconductor chips including gate electrodes 31a to 31d, first source electrodes 32a to 32d, and second source electrodes 33a to 33d respectively on an upper face, and the semiconductor chips are mounted on lead frames 34a to 34d respectively. The second source electrodes 33a to 33d are reference potentials for driving gates of the semiconductor chips, and are disposed symmetrically sandwiching, for example, the gate electrodes 31a to 31d.

The diodes 5a and 5b configuring the rectifying circuit 5 include semiconductor chips having a cathode electrode on a bottom face and an anode electrode on an upper face, and are mounted on a lead frame 51. Reference signs 35, 36a to 36d, 37a to 37d, 52a, and 52b indicate lead frames, and the lead frames 34a to 34d, 35, 36a to 36d, 37a to 37d, 51, 52a, and 52b are isolated from a cooling member 11 by an isolating member 10.

The semiconductor elements 3a to 3d, the diodes 5a and 5b, the lead frames 35, 36a to 36d, 34a to 34d, 37a to 37d, 52a, 52b, and 51, the cooling member 11, the isolating member 10, and plate-form wiring members 38 to 38d configured of plate-form members, are sealed with a sealing resin 12 formed of a silicon resin, causing a face of the cooling member 11 in a direction of a bottom face of the module 9 to be exposed. Also, the lead frames 35, 36a to 36d, 34a to 34d, 37a to 37d, 52a, 52b, and 51 are bent in a direction of an upper face of the module 9, configuring external terminals of the module 9. In the sectional perspective view of FIG. 2B, the plate-form wiring members 38a to 38d are omitted. The plate-form wiring members 38a to 38d will be described hereafter.

The drain electrode of the semiconductor element 3a is mounted on the lead frame 34a, and the lead frame 34a is connected to a positive electrode of the input power supply 1 via a glass epoxy substrate wiring pattern or the like. The first source electrode 32a of the semiconductor element 3a is mounted on the lead frame 34b using the plate-form wiring member 38a, and the lead frame 34b is connected to the primary winding 4a of the transformer 4 via a glass epoxy substrate wiring pattern or the like. The drain electrode of the semiconductor element 3b is mounted on the lead frame 34b. The first source electrode 32b of the semiconductor element 3b is connected to the lead frame 35 using the plate-form wiring member 38b, and the lead frame 35 is connected to a negative electrode of the input power supply 1 via a glass epoxy substrate wiring pattern or the like.

The drain electrode of the semiconductor element 3c is mounted on the lead frame 34c, and the lead frame 34c is connected to the positive electrode of the input power supply 1 via a glass epoxy substrate wiring pattern or the like. The first source electrode 32c of the semiconductor element 3c is connected to the lead frame 34d using the plate-form wiring member 38c, and the lead frame 34d is connected to the primary winding 4a of the transformer 4 via a glass epoxy substrate wiring pattern or the like. The drain electrode of the semiconductor element 3d is mounted on the lead frame 34d. The first source electrode 32d of the semiconductor element 3d is connected to the lead frame 35 using the plate-form wiring member 38d. Also, the lead frames 36a to 36d are connected to a gate circuit mounted on a glass epoxy substrate via a glass epoxy substrate wiring pattern.

The diode 5a is connected from an anode electrode 53a to the lead frame 52a by a plate-form wiring member 54a, and the lead frame 52a is connected to the secondary winding 4b of the transformer 4 by soldering, welding, or the like. Also, the diode 5b is connected from an anode electrode 53b to the lead frame 52b by a plate-form wiring member 54b, and the lead frame 52b is connected to the secondary winding 4b of the transformer 4 by soldering, welding, or the like. Also, cathode electrodes of the diodes 5a and 5b are mounted on the same lead frame 51, and the lead frame 51 is connected to the smoothing reactor 6.

The lead frames 34a and 34c may be connected on a glass epoxy substrate that is an outer side of the module 9, or may be connected in an interior of the module 9 by mounting a plate-form wiring member that straddles the lead frame 35.

The gate electrodes 31a to 31d of the semiconductor elements 3a to 3d are connected to the lead frames 36a to 36d with, respectively, wire wiring members 29a to 29d configured of wire, and the second source electrodes 33a to 33d are connected to the lead frames 37a to 37d with wire wiring members 30a to 30d respectively. The plate-form wiring members 38a to 38d, 54a, and 54b are configured of flat plate-form conductors, copper plates for example, such as bus bars.

Although the heretofore described configuration is such that the lead frames 34a, 34c, and 35 and the input power supply 1 are connected via glass epoxy substrate wiring patterns, the lead frames 34a, 34c, and 35 and the input power supply 1 may be connected directly without passing through wiring patterns. Although the lead frames 34b and 34d are connected to the primary winding 4a of the transformer 4 via the glass epoxy substrate wiring pattern, the lead frames 34b and 34d may be connected to the primary winding 4a directly, not via the wiring pattern. Although the lead frames 52a and 52b are connected to the secondary winding 4b of the transformer 4 by soldering, welding, or the like, the lead frames 52a and 52b may be connected to the secondary winding 4b via a wiring pattern on a glass epoxy substrate. Furthermore, other than a silicon resin, an epoxy resin or the like can be used as the sealing resin 12.

Figure 3:
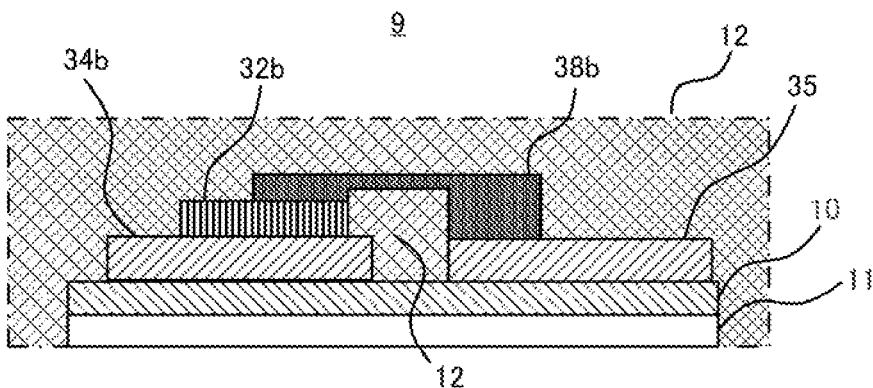
FIG. 3 is a sectional view, wherein one portion is omitted, of a semiconductor element periphery configuration wherein an A-A line cross-section of FIG. 2A is seen from an arrow B direction.

Next, a configuration of a periphery of the semiconductor elements 3a to 3d configuring the module 9 will be described, using FIG. 3. FIG. 3 is a configuration drawing of a periphery of a semiconductor element, wherein an A-A line cross-section of FIG. 2A is seen from an arrow B direction, and is a sectional view wherein one portion is omitted. Hereafter, the description will be given focusing mainly on the semiconductor element 3b, but the other semiconductor elements 3a, 3c, and 3d are configured in the same way. The lead frames 36b and 37b are omitted in FIG. 3 in order to simplify the drawing, and a portion of the lead frame 34b formed to be oriented in a direction of the upper face of the module 9 is also omitted.

In FIG. 3, the semiconductor chip of the semiconductor element 3b is fixed via a conductive adhesive to the lead frame 34b, which is disposed via the isolating member 10 on the cooling member 11. Furthermore, the first source electrode 32b on the upper face of the semiconductor chip of the semiconductor element 3b, and the other lead frame 35, are connected by the plate-form wiring member 38b. Normally, a sectional area of the plate-form wiring member 38b is determined in accordance with a rated current, because of which the plate-form wiring member 38b may fuse when an overcurrent flows in the event of an abnormality. The plate-form wiring member 38b and the first source electrode 32b are joined by soldering using a direct lead bonding method. Unlike an existing wire mounting, a direct lead bonding method is a method whereby a plate-form conductor is mounted on an electrode on a semiconductor chip upper face using a bonding member such as a solder.

The plate-form wiring member 38b, the first source electrode 32b, and the material and bonding method for bonding the plate-form wiring member 38b have been described as being copper, a solder, and a direct lead bonding method respectively, but not being limited to this, and another material or bonding method may be used. Also, a form of the plate-form wiring member 38b is not limited to a plate-form as depicted in the first embodiment, and may be a form formed by bending a plate-form member.

In the present embodiment, the fuse 8 and the plate-form wiring members 38a to 38d of the semiconductor elements 3a to 3d fusing means that a fusible portion of the fuse 8, that is, a fuse element, and the plate-form wiring members 38a to 38d connected to the upper faces of the semiconductor chips of the semiconductor elements 3a to 3d melt, becoming electrically and physically severed. A fusible portion of the fuse 8 refers to a portion that is installed in a fuse interior and fuses when an overcurrent flows. Also, although not shown in FIG. 3, the cooling member 11 of the module 9 is fixed to a cooler via a heat dissipating member such as a thermal grease, and is installed in an interior of the power conversion device.

Next, an operation of the power conversion device of the present embodiment will be described.

The DC-DC converter that is the power conversion device according to the present embodiment mainly carries out operations in four modes.

In mode 1, the semiconductor elements 3a and 3d are in a conductive state, and the semiconductor elements 3b and 3c are in a non-conductive state. In this state, a current flows into the primary winding 4a of the transformer 4 from the top to the bottom of FIG. 1, and a current flows in a forward direction of the diode 5a into the secondary winding 4b.

In mode 2, all of the semiconductor elements 3a to 3d are in a non-conductive state, no power is transmitted to the secondary winding 4b of the transformer 4, and there is only a current generated by self-induction of the smoothing reactor 6.

In mode 3, the semiconductor elements 3a and 3d are in a non-conductive state and the semiconductor elements 3b and 3c are in a conductive state, which is the opposite of mode 1. In this state, a current flows into the primary winding 4a of the transformer 4 from the bottom to the top of FIG. 1, and a current flows in a forward direction of the diode 5b into the secondary winding 4b.

In mode 4, all of the semiconductor elements 3a to 3d are in a non-conductive state again, no power is transmitted to the secondary winding 4b of the transformer 4, and there is only a current generated by self-induction of the smoothing reactor 6.

By mode 1 to mode 4 being repeated, and an operating cycle of each mode being adjusted, a target output can be obtained.

Switching of mode 1 to mode 4 is realized by applying voltage at a desired timing to the gate electrodes 31*a* to 31*d* of the semiconductor elements 3*a* to 3*d* using a gate drive circuit, thereby turning the semiconductor elements 3*a* to 3*d* on and off. As the semiconductor elements 3*a* to 3*d* are caused by the gate drive circuit to operate in such a way as to switch between on and off in this way, a short circuit failure occurs when a failure of the gate drive circuit or a malfunction occurs. In this case, an overcurrent that considerably exceeds a rated current flows into the semiconductor elements 3*a* to 3*d*.

When an overcurrent flows into a semiconductor element, a wiring member that is mounted on an electrode on an upper face of a semiconductor chip of the semiconductor element and connects the semiconductor chip and a lead frame fuses, and heat damage occurs. Using FIGS. 4A to 4D, a description of this structure will be given adopting a case wherein a wiring member is an existing wire wiring member.

FIGS. 4A to 4D are drawings showing a peripheral structure of a semiconductor chip configuring the semiconductor element 3*b* when the power conversion device shown in FIGS. 1 to 3 is such that the fuse 8 is not mounted, and the plate-form wiring member 36*b* configured of a copper plate is changed to a wire wiring member W configured of wire.

Figure 4A:
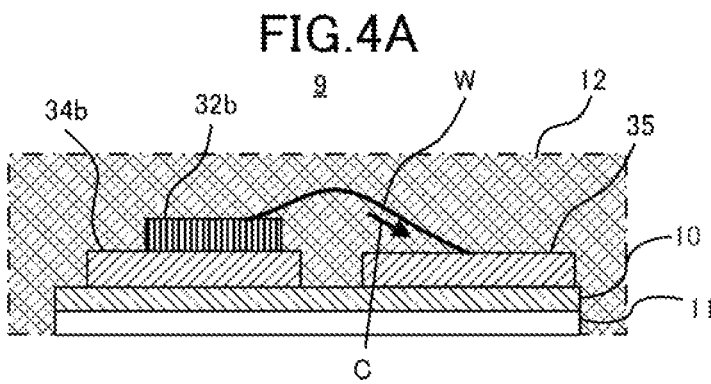
FIGS. 4A to 4D are sectional views showing a structure of a fusion of a wire wiring member mounted on an upper face of a semiconductor chip configuring a semiconductor element.

FIG. 4A shows a state wherein an overcurrent has flowed into the wire wiring member W, which connects the first source electrode 32*b* configuring the semiconductor chip of the semiconductor element 3*b* and the lead frame 35, and a flowing current is indicated schematically by an arrow C.

Figure 4B:
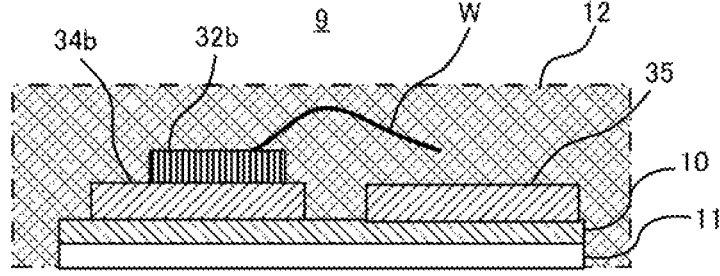
Figure 4C:
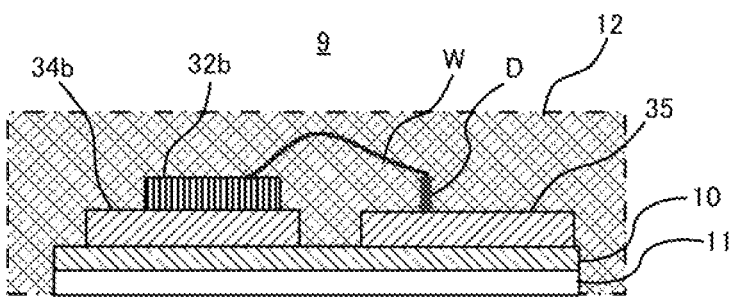

FIG. 4B shows a state wherein the wire wiring member W has fused due to the overcurrent flowing into the wire wiring member W. In this state, the input power supply 1 of the power conversion device is of a high voltage, a potential difference occurs in a portion indicated by an arrow D due to voltage continuing to be applied to a fused portion, as shown in FIG. 4C, and a carbonized portion E is formed by the fused portion being carbonized, as shown in FIG. 4D.

Figure 4D:
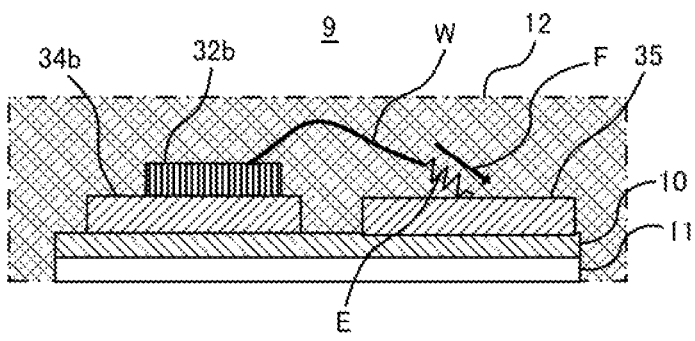

As shown in FIG. 4D, the carbonized portion E can be shown as an electrical resistor, and an energizing circuit, indicated by an arrow F, connecting from the wire wiring member W to the lead frame 35 via the sealing resin 12 is formed. Resistance of the carbonized sealing resin 12 has a value that is a little high in comparison with that of a normal conductor. Because of this, a value of the current continuing to flow into the semiconductor element 3*b* is low in accordance with the resistance value, and continues to flow even after the wire wiring member W has fused, an abnormal heat generation occurs in the carbonized portion E of the sealing resin 12, and furthermore, there is a possibility of heat damage occurring.

Next, a method of protecting the semiconductor elements 3*a* to 3*d* according to the first embodiment will be described.

Figure 5:
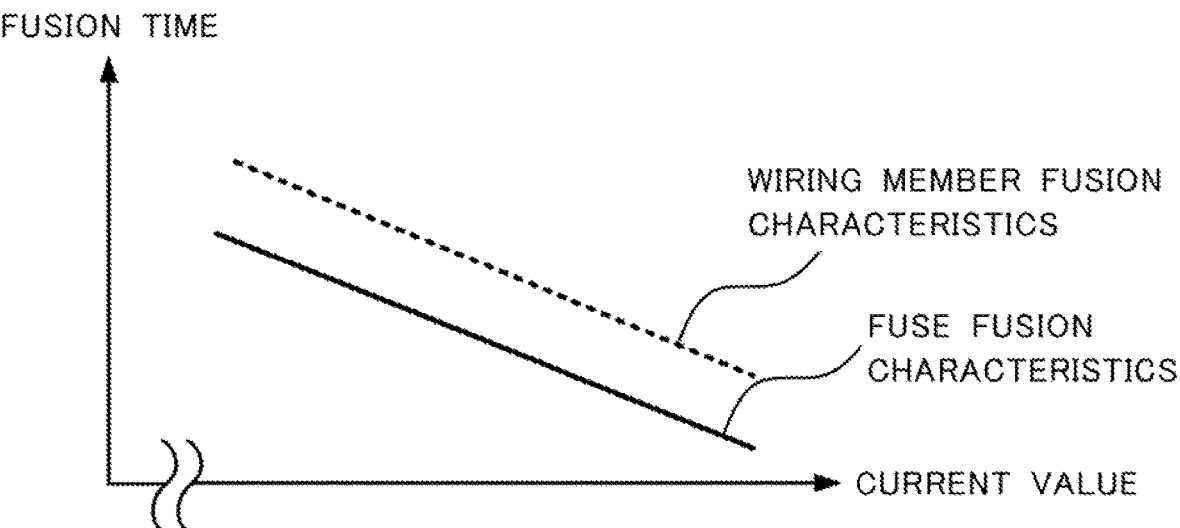
FIG. 5 is a drawing showing fusion characteristics of a fuse and a plate-form wiring member of the power conversion device according to the first embodiment.

FIG. 5 is a graph of current-fusion time characteristics (hereafter called fusion characteristics) of the fuse 8 of FIG. 1 and the plate-form wiring members 38*a* to 38*d*, wherein a vertical axis shows fusion time and a horizontal axis shows current value, and shows a time needed until each part fuses with respect to a certain current value.

Specifically, the graph shows that the lower a portion in which a fusion time is plotted, the shorter the fusion time, and conversely, the higher a portion in which a fusion time is plotted, the longer the fusion time. In the present embodiment, the fuse 8 is connected in series with the semiconductor element 3*b*, as shown in FIG. 1, and the fusion time of the fuse 8 is set to be shorter than that of the plate-form wiring members 38*a* to 38*d* connected to the first source electrodes 32*a* to 32*d* of the semiconductor elements 3*a* to 3*d*. By the fusion characteristics being ordered in this way, the fuse 8 fuses first when an overcurrent occurs, and a current flowing into the plate-form wiring member 38*b* of the semiconductor element 3*b* connected in series to the fuse 8 and an applied voltage can be interrupted instantaneously. Consequently, according to this configuration, no potential difference occurs between the plate-form wiring members 38*a* to 38*d* and the lead frames 35, 34*b*, and 34*d*, because of which no resin carbonization accompanying an arc generation occurs, meaning that a power conversion device wherein there is no occurrence of heat damage accompanying an abnormal heat generation caused by current flowing into a carbonized portion can be realized.

Next, advantages of combining the plate-form wiring members 38*a* to 38*d* configured of copper plates and the fuse 8 will be described.

Conventionally, as shown in FIGS. 4A to 4D, the first source electrode 32*b* of the semiconductor element 3*b* and the lead frame 35 are connected by the wire wiring member W, and a fusion time of the wire wiring member W is short. Consequently, as it is necessary that a fusion time of the fuse 8 is shorter than the fusion time of the wire wiring member W, as shown in FIG. 5, it is necessary to apply the fuse 8 that has a short fusion time and is high-priced.

In response to this, the present embodiment is such that the plate-form wiring member 38*b* configured of a flat copper plate is used as a wiring member that connects the first source electrode 32*b* of the semiconductor element 3*b* and the lead frame 35 using a direct lead bonding method, as shown in FIGS. 2A and 2B, because of which a sectional area through which the current of the plate-form wiring member 38*b* flows is greater than when the wiring member is configured of the wire wiring member W, and a resistance value is small. For example, when the existing wire wiring member W is mounted, a total sectional area of all the wire wiring members W mounted on the semiconductor elements 3*a* to 3*d* is in the order of 0.1 mm², but in the case of the plate-form wiring members 38*a* to 38*d*, a total sectional area is in the order of several square millimeters, because of which the resistance value can be considerably reduced. Also, as the form of the plate-form wiring members 38*a* to 38*d* is a flat plate form, a heat dissipating area can be increased with respect to that of the wire wiring member W. The above reasons mean that when an overcurrent flows into the plate-form wiring members 38*a* to 38*d*, a temperature rise is smaller than in the case of the wire wiring member W, and the fusion time is longer, because of which a low-cost fuse with a long fusion time can be applied as the fuse 8.

As previously described, there is an existing method whereby the number of wire wiring members W connecting the first source electrode 32*b* of the semiconductor element 3*b* and the lead frame 35 is increased in order to reduce the cost of the fuse 8. According to this method, the fusion time of the wire wiring member W is lengthened, and a low-priced fuse can be applied, but when the number of wire wiring members W mounted on the first source electrode 32*b* increases, time is needed to mount the wire wiring members W. Also, when the wire wiring member W is mounted on an upper face of the first source electrode 32*b*, mounting is commonly carried out by utilizing ultrasound, but this method is a method such that the wire wiring members W are mounted by being brought into contact one by one with the electrode on the upper face of the first source electrode 32*b*, and ultrasound being applied, meaning that the greater the number of wire winding members W, the more a fabrication time increases, and the cost increases.

Also, when a failure occurs in even one of the wire wiring members W mounted on a semiconductor chip, the semiconductor chip becomes a defective article, even when the other wire wiring members W mounted on the same semiconductor chip are normal, because of which yield worsens as the number of wires is increased.

For these reasons, the fuse 8 decreases in price when the number of wire wiring members W is increased, but time is needed to mount the wire wiring members W, and the yield worsens, because of which a manufacturing cost increases considerably, and the power conversion device conversely increases in cost.

In response to this, in the present embodiment, the plate-form wiring member 38a formed of a flat copper plate is connected to the first source electrode 32b of the semiconductor element 3b and the lead frame 35 using a direct lead bonding method, because of which, unlike when the wire wiring member W is mounted, there is no increase in mounting time or worsening of yield accompanying an increase in the number of wire wiring members W, there is no increase in wiring member manufacturing cost, and the low-priced fuse 8 can be applied.

In addition, when a multiple of wire wiring members W are mounted using the existing method, a second and subsequent wire wiring members W are mounted on an electrode on a semiconductor chip upper face leaving a certain interval from the previously mounted wire wiring member W in order to avoid coming into contact with the previously mounted wire wiring member W, because of which there is a portion of an area of the electrode on the semiconductor chip upper face to which the wire wiring member W can physically not be connected. Consequently, when the number of wire wiring members W is increased in order to apply a low-priced fuse, there is not only an increase in manufacturing cost, but also an increase in an area of a semiconductor chip upper face in order to secure an area of an electrode needed to mount the wire wiring members W, and the semiconductor element also increases in cost.

In response to this, when the plate-form wiring member 38b is mounted, as in the embodiment, the plate-form wiring member 38b can be physically connected to the whole electrode of the semiconductor chip of the semiconductor element 3b, unlike the case of mounting the wire wiring member W. Also, when wishing to lower the resistance value by increasing the sectional area of the plate-form wiring member 38b, the sectional area over which current flows can easily be increased by increasing a thickness of the copper plate. This means that even when the area of the electrode of the semiconductor chip is small, the sectional area over which current flows can be widely secured, and the resistance value of the plate-form wiring member 38b can be reduced, because of which there is no longer a need to increase chip size, meaning that an increase in cost of the semiconductor element 3b can be prevented.

Next, advantages of the lead frame 35 configuring the module 9 will be described. As shown in FIGS. 1, 2A, and 2B, the lead frame 35 is of the same potential as the sources of the semiconductor elements 3b and 3d, and connects the input power supply 1 and the sources of the semiconductor elements 3b and 3d via the plate-form wiring members 38b and 38d. Also, the plate-form wiring members 38a to 38d dissipate heat from the lead frames 34a to 34d to the cooler via the isolating member 10 and the cooling member 11. At this time, the heat spreads owing to the cooling member 11, and when an area of the bottom face of the module 9 increases owing to the existence of the lead frame 35, heat of the plate-form wiring members 38a to 38d is more easily dissipated to the cooler, because of which the temperature of the plate-form wiring members 38a to 38d decreases, and the fusion time increases.

Also, owing to the lead frame 35 being mounted and the area of the cooling member 11 increasing, a rise in temperature of the semiconductor chip of the semiconductor element 3b is restricted. Because of this, an effect of thermal interference in the plate-form wiring member 38b from the semiconductor chip can be mitigated, meaning that a rise in temperature of the plate-form wiring member 38b can be restricted, and the fusion time of the plate-form wiring member 38b can be increased. Consequently, a low-priced fuse with a fusion time that is longer by an amount commensurate with the amount by which the fusion time of the plate-form wiring members 38a to 38d increases can be applied as the fuse 8, and the power conversion device can be reduced in cost.

Next, advantages of the module 9 having the isolating member 10 and the cooling member 11 in the embodiment will be described.

As a method of isolating a cooler and a module in the case of a module in which no isolating member isolating from the cooler is installed, there is, for example, a method whereby an insulating paper is disposed between the cooler and the module, and connected to the cooler. In this case, the module is normally fixed using a spring or the like, but as there is a limit to a pressure of the spring, gaps occur between the insulating paper and the module and between the insulating paper and the cooler, and thermal resistance at these interfaces increases. Consequently, heat dissipating properties of a wiring member in an interior of the module are poor, and the temperature of the wiring member rises, because of which the fusion time when an overcurrent flows into the wiring member is short.

In response to this, the case of the kind of module 9 shown in FIG. 3, which is fabricated by the isolating member 10 and the cooling member 11 being sealed using the sealing resin 12, will be described.

As the kind of configuration shown in FIG. 3 is fabricated by a high pressure being applied to the cooling member 11 and the isolating member 10, the isolating member 10 can be reduced in thickness, and no gap occurs between the isolating member 10 and the cooling member 11, because of which thermal resistance of the isolating member 10 and thermal resistance at an interface between the isolating member 10 and the cooling member 11 can be reduced.

Furthermore, with regard to the plate-form wiring member 38b, configuring using a flat copper plate means that the sectional area over which a current flows is greater, the resistance value is smaller, and the surface area is greater than in a case of configuring using a wire wiring member, because of which loss is smaller, and heat dissipation is easier, meaning that a temperature rise can be restricted. Consequently, the fusion time of a wiring member can be increased considerably by the plate-form wiring member 38b being configured of a copper plate, and the semiconductor element 3b being mounted in the module 9. Consequently, a low-priced fuse with a fusion time that is longer by an amount commensurate with the amount by which the fusion time of the plate-form wiring members 38a to 38d increases can be applied as the fuse 8, and the power conversion device can be reduced in cost.

Next, advantages of the primary side semiconductor elements 3a to 3d of the transformer 4 and the secondary side diodes 5a and 5b of the transformer 4 being fabricated in the same package in the embodiment will be described.

The kind of step-down converter shown in FIG. 1 of the embodiment is such that as voltage supplied from the input power supply 1 is stepped down, and a voltage lower than the input voltage is output to the load 2, and the input power is equal to the output power, current flowing into the output side diodes 5a and 5b is greater than current flowing into the input side semiconductor elements 3a to 3d. Because of this, a wiring member applied to the output side diodes 5a and 5b is commonly configured of a flat copper plate, unlike a wiring member applied to the semiconductor elements 3a to 3d. Meanwhile, as current flowing into the input side semiconductor elements 3a to 3d is smaller than current flowing into the output side diodes 5a and 5b, the wiring members 38a to 38d applied to the semiconductor elements 3a to 3d are commonly configured of wire wiring members.

In an existing configuration, as described above, a wire wiring member is mounted on semiconductor elements 2a to 2d, and a plate-form wiring member formed of a flat copper plate is mounted on diodes 4a and 4b, because of which the wire wiring member and the plate-form wiring member need to be mounted using separate devices, there are a large number of man-hours, and a manufacturing cost is high.

In response to this, in the embodiment, the semiconductor elements 3a to 3d and the diodes 5a and 5b are fabricated in the same package, and the plate-form wiring members 38a to 38d, 54a, and 54b configured of copper plates are applied, because of which the plate-form wiring members 38a to 38d, 54a, and 54b can be fabricated collectively using the same device, and the wiring member manufacturing cost can be reduced.

Also, the plate-form wiring members 38a to 38d, 54a, and 54b mounted on the semiconductor elements 3a to 3d, 53a and 53b are all configured of copper plates of the same form. Normally, forms of the plate-form wiring members 38a to 38d, 54a, and 54b are determined by chip position, distance between lead frames, forms of a semiconductor chip and a lead frame, and rated current of a semiconductor chip, because of which the plate-form wiring members 38a to 38d, 54a, and 54b are not necessarily of the same form, but in the embodiment, a position between a semiconductor chip and a lead frame and form of a lead frame form are adjusted, and the rated current of the plate-form wiring members 38a to 38d, 54a, and 54b is designed in such a way as to satisfy rated currents of both the semiconductor elements 3a to 3d and the diodes 5a and 5b, because of which the plate-form wiring members 38a to 38d, 54a, and 54b can be of the same form.

By adopting this kind of configuration, copper plates mounted on the plate-form wiring members 38a to 38d, 54a, and 54b can be standardized, because of which copper plate management when manufacturing is easy, and management costs can be reduced. Also, dies can also be standardized, and a die manufacturing cost and management costs can also be reduced.

Also, in the embodiment, MOSFETs are used as the semiconductor elements 3a to 3d, but not being limited to this, the same advantages can be obtained using, for example, IGBTs and diodes.

Also, in the embodiment, the fuse 8 is connected in series to the positive electrode side of the input power supply 1, but has the same advantages when contrarily connected to a negative electrode side.

Also, in the embodiment, the power conversion device is an insulated converter, but not being limited to this, the same advantages can be obtained when the power conversion device is a non-insulated converter.

In the embodiment, a step-down converter wherein voltage on the output side is lower than that on the input side is used, but not being limited to this, the same advantages can be obtained when using a step-up converter wherein voltage on the output side is higher than that on the input side. In this case, there is a higher voltage on the secondary side, because of which the same advantages can be obtained by disposing a fuse 8A in a stage after the portion of the transformer 4, as shown in FIG. 6.

Figure 6:
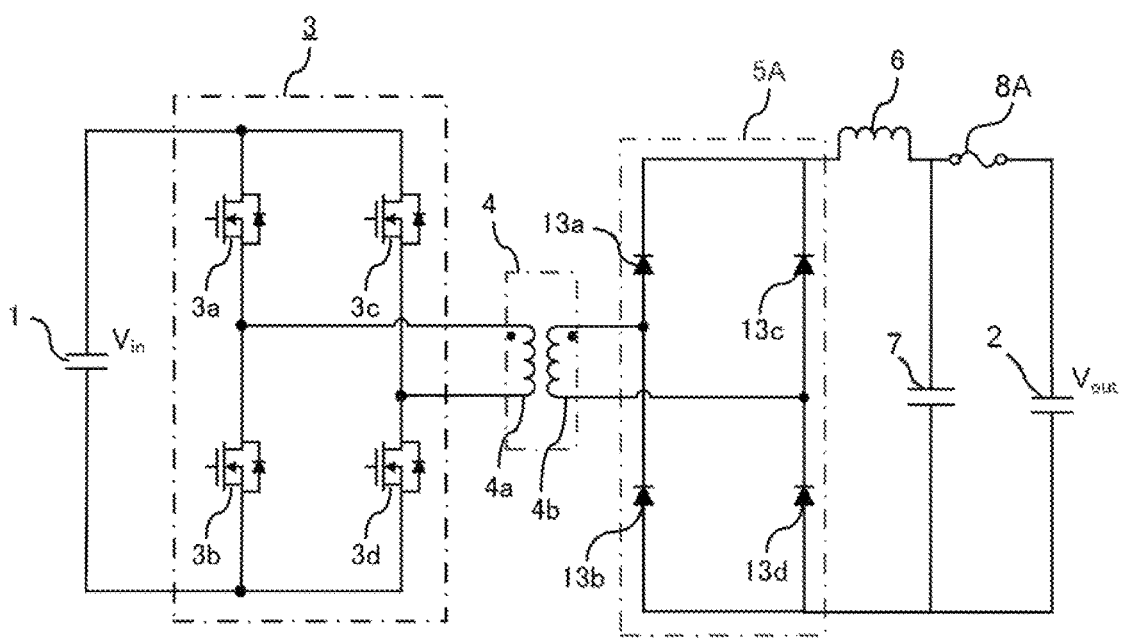
FIG. 6 is a circuit drawing showing an example of a modified configuration of the power conversion device according to the first embodiment.

Also, in the first embodiment, a description has been given using a configuration wherein the single-phase inverter 3, configured of the semiconductor elements 3a to 3d, and the fuse 8 are connected in series, but the same advantages can be obtained using a configuration wherein the fuse 8A is connected in series to a rectifying circuit 5A configured of the diodes 13a to 13d, as shown in FIG. 6. This configuration is such that the diodes 13a to 13d configuring the rectifying circuit 5A are such that mounted wiring members are configured of copper plates, in the same way as the semiconductor elements 3a to 3d, and the fusion time of the fuse 8A is set to be shorter than the fusion time of the plate-form wiring members configured of copper plates mounted on the diodes 13a to 13d. High reliability can also be obtained using a power conversion device of a configuration wherein the rectifying circuit 4A is used.

Although the present application is described above in terms of an exemplary embodiment, it should be understood that the various features, aspects, and functions described in the embodiment are not limited in their applicability to the particular embodiment with which they are described, but instead can be applied, alone or in various combinations, to the embodiment. It is therefore understood that numerous modifications which have not been exemplified can be devised without departing from the scope of the present application. For example, at least one constituent components may be modified, added, or eliminated.

What is claimed is:

1. A power conversion device, comprising:
   a fuse connected to an input power supply, and
   a semiconductor element connected in series to the input power supply via the fuse, wherein
   the semiconductor element has a semiconductor chip, which has an electrode on an upper face thereof, and a plate-form wiring member, which is mounted on the electrode and is formed only of a plate-form conductor through which current passing through the fuse flows, and is configured by the semiconductor chip and the plate-form wiring member being sealed using a sealing resin, and a fusion time of the fuse is shorter than a fusion time of the plate-form wiring member, and
   the semiconductor element has a multiple of the semiconductor chips, a multiple of the plate-form wiring members mounted one each on upper face electrodes of the multiple of semiconductor chips, a multiple of lead frames on each of which one of the multiple of semiconductor chips is mounted, and a lead frame on which the semiconductor chip is not mounted, and is configured of a module sealed in the same package using the sealing resin, and
   at least one of the multiple of plate-form wiring members is connected to the lead frame on which the semiconductor chip is not mounted.

2. The power conversion device according to claim 1, wherein the multiple of plate-form wiring members are all of the same form.

3. The power conversion device according to claim 2, wherein the semiconductor element has a cooling member that cools the semiconductor chip and an isolating member that isolates the semiconductor chip and the cooling member.

4. The power conversion device according to claim 1, wherein the semiconductor element has a cooling member that cools the semiconductor chip and an isolating member that isolates the semiconductor chip and the cooling member.

5. A power conversion device, comprising:

a fuse connected to an input power supply;

a primary side semiconductor element that is connected in series to the input power supply via the fuse and converts power of the input power supply;

a transformer that transmits the converted power from a primary side to a secondary side; and a secondary side semiconductor element that converts power output to the secondary side of the transformer, wherein the primary side semiconductor element and the secondary side semiconductor element have a semiconductor chip, which has an electrode on an upper face thereof, and a plate-form wiring member formed only of a plate-form conductor, and are configured of a module sealed in the same package using a sealing resin, current that passes through the fuse flows through the plate-form wiring member of the primary side semiconductor element, and a fusion time of the fuse is shorter than a fusion time of the plate-form wiring member, the primary side semiconductor element and the secondary side semiconductor element have a multiple of the semiconductor chips, a multiple of the plate-form wiring members mounted one each on upper face electrodes of the multiple of semiconductor chips, a multiple of lead frames on each of which one of the multiple of semiconductor chips is mounted, and a lead frame on which the semiconductor chip is not mounted, and at least one of the multiple of plate-form wiring members is connected to the lead frame on which the semiconductor chip is not mounted.

6. The power conversion device according to claim 5, wherein the multiple of plate-form wiring members are all of the same form.

7. The power conversion device according to claim 6, wherein the primary side semiconductor element and the secondary side semiconductor element have a cooling member that cools the semiconductor chip and an isolating member that isolates the semiconductor chip and the cooling member.

8. The power conversion device according to claim 5, wherein the primary side semiconductor element and the secondary side semiconductor element have a cooling member that cools the semiconductor chip and an isolating member that isolates the semiconductor chip and the cooling member.

* * * * *